(12) United States Patent
Cheng et al.

(10) Patent No.: US 8,367,515 B2
(45) Date of Patent: Feb. 5, 2013

(54) HYBRID SHALLOW TRENCH ISOLATION FOR HIGH-K METAL GATE DEVICE IMPROVEMENT

(75) Inventors: Chung Long Cheng, Baoshan Township, Hsinchu County (TW); Kong-Beng Thei, Hsin-Chu Country (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 268 days.

(21) Appl. No.: 12/330,347

(22) Filed: Dec. 8, 2008

(65) Prior Publication Data
US 2010/0087043 A1   Apr. 8, 2010

Related U.S. Application Data

(60) Provisional application No. 61/102,962, filed on Oct. 6, 2008.

(51) Int. Cl.
*H01L 21/76* (2006.01)
(52) U.S. Cl. ......... 438/424; 257/E21.548; 257/E21.546; 438/435
(58) Field of Classification Search .................. 438/435; 257/E21.548
See application file for complete search history.

(56) References Cited

U.S. PATENT DOCUMENTS

| | | | |
|---|---|---|---|
| 2003/0006476 A1* | 1/2003 | Chen et al. | 257/510 |
| 2004/0171271 A1* | 9/2004 | Heo et al. | 438/700 |
| 2005/0009293 A1* | 1/2005 | Kim et al. | 438/424 |
| 2005/0142795 A1* | 6/2005 | Ahn et al. | 438/400 |
| 2005/0287731 A1* | 12/2005 | Bian et al. | 438/201 |
| 2006/0043455 A1* | 3/2006 | Batra et al. | 257/314 |
| 2006/0175718 A1* | 8/2006 | Nitta | 257/797 |
| 2008/0020534 A1* | 1/2008 | Culmsee et al. | 438/296 |
| 2008/0272406 A1* | 11/2008 | Banna | 257/270 |
| 2009/0256233 A1* | 10/2009 | Eun | 257/510 |

FOREIGN PATENT DOCUMENTS
CN       101419942       4/2009

OTHER PUBLICATIONS

Chinese Patent Office, Office Action dated Oct. 29, 2010; Application No. 200910132732.5. 3 pages.

* cited by examiner

*Primary Examiner* — Ha Tran T Nguyen
*Assistant Examiner* — Shaka White
(74) *Attorney, Agent, or Firm* — Haynes and Boone, LLP

(57) ABSTRACT

A method for fabricating a semiconductor device with improved performance is disclosed. The method comprises providing a substrate including a first region and a second region; forming at least one isolation region having a first aspect ratio in the first region and at least one isolation region having a second aspect ratio in the second region; performing a high aspect ratio deposition process to form a first layer over the first and second regions of the substrate; removing the first layer from the second region; and performing a high density plasma deposition process to form a second layer over the first and second regions of the substrate.

20 Claims, 5 Drawing Sheets

HYBRID SHALLOW TRENCH ISOLATION FOR HIGH-K METAL GATE DEVICE IMPROVEMENT

PRIORITY DATA

This application claims priority to Provisional Application Ser. No. 61/102,962 filed on Oct. 6, 2008, entitled "Hybrid Shallow Trench Isolation For High-K Metal Gate Device Improvement," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also significantly increased the height to width ratio, the aspect ratio, of gaps that separate adjacent devices of ICs. Some ICs may include regions having gaps with varying aspect ratios. Conventional processing fills gaps with the same process. For example, gaps with varying aspect ratios are simultaneously filled with a high density plasma oxide. However, it has been observed that utilizing the same process for filling gaps with varying aspect ratios results in the formation of voids within gaps having higher aspect ratios. These voids contribute to poor device performance and junction leakage in areas with higher aspect ratio gaps.

Accordingly, what is needed is a method for making a semiconductor device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
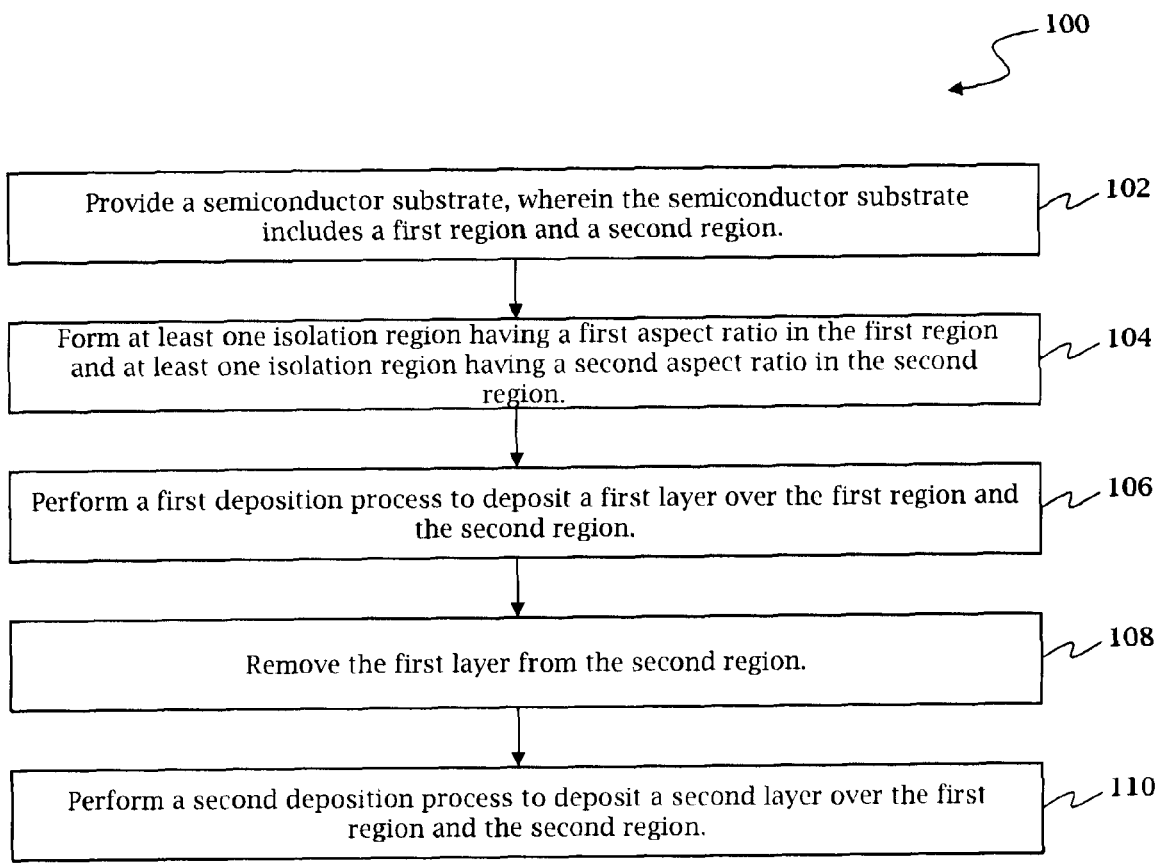
FIG. 1 is a flow chart of a method for fabricating a semiconductor device according to aspects of the present invention.

The present disclosure relates generally to methods for manufacturing semiconductor devices, and more particularly, to a method for manufacturing a semiconductor device that improves device performance by eliminating voids that arise while filling gaps with varying aspect ratios.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
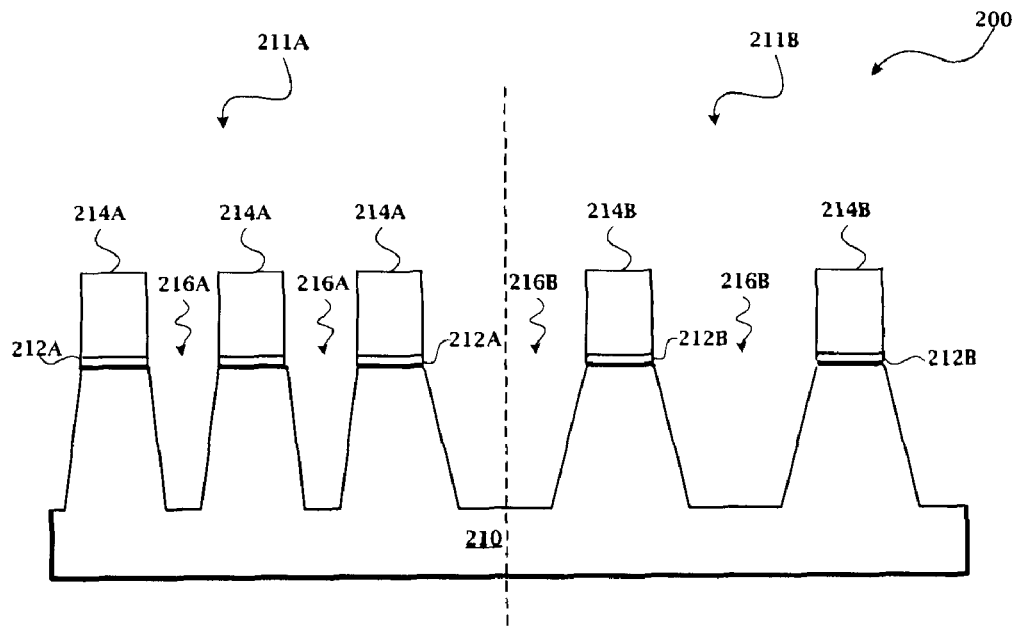
FIGS. 2A-2G are various cross-sectional views of embodiments of a semiconductor device during various fabrication stages according to the method of FIG. 1.
Figure 2B:
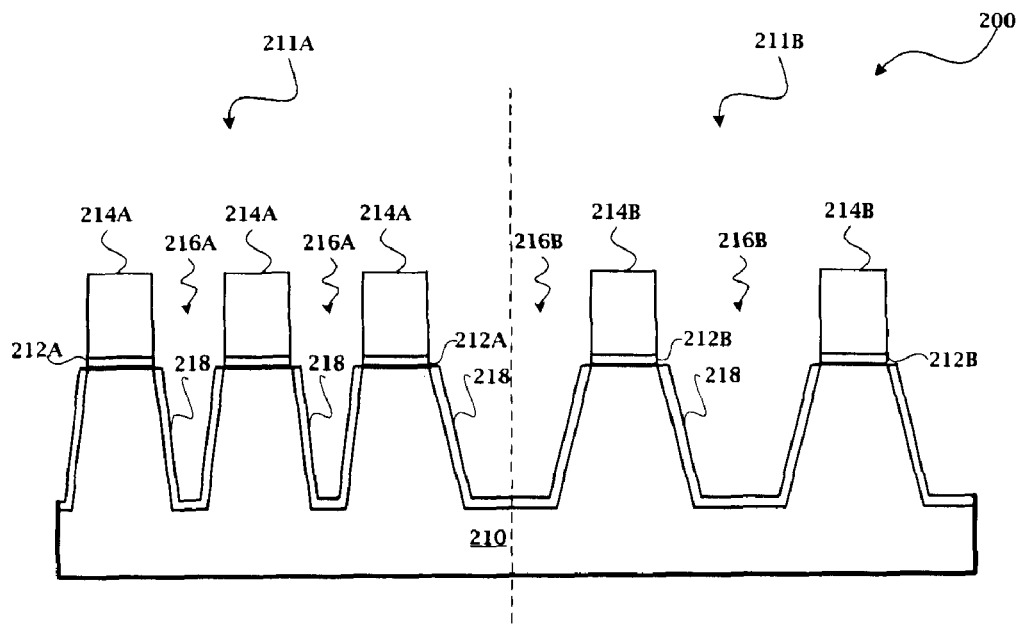
Figure 2C:
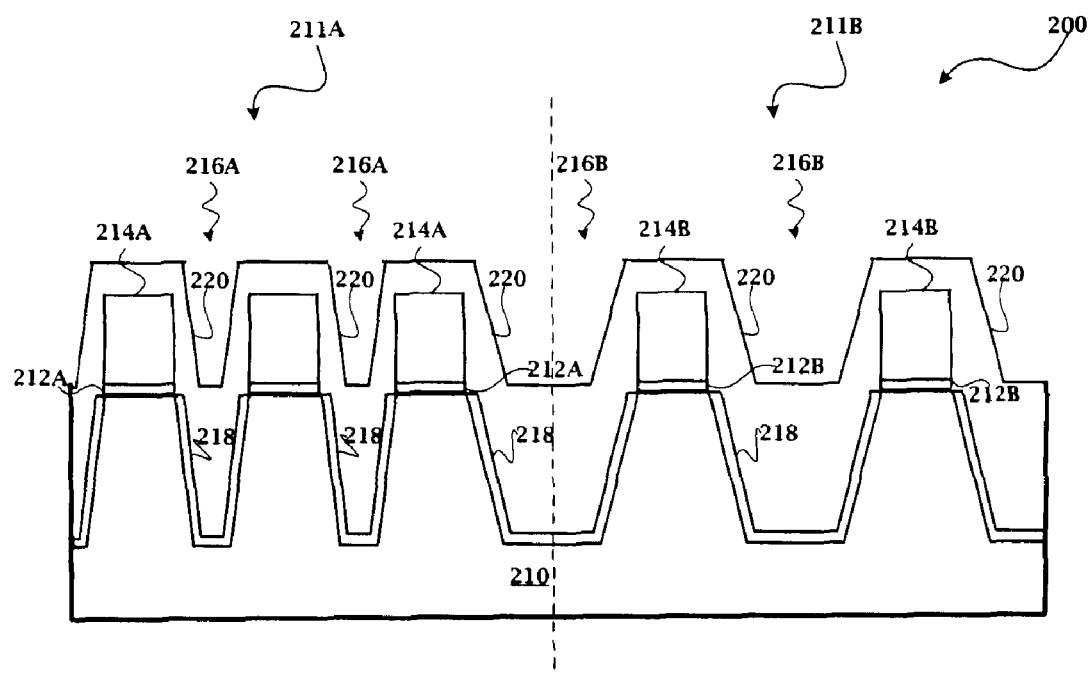
Figure 2D:
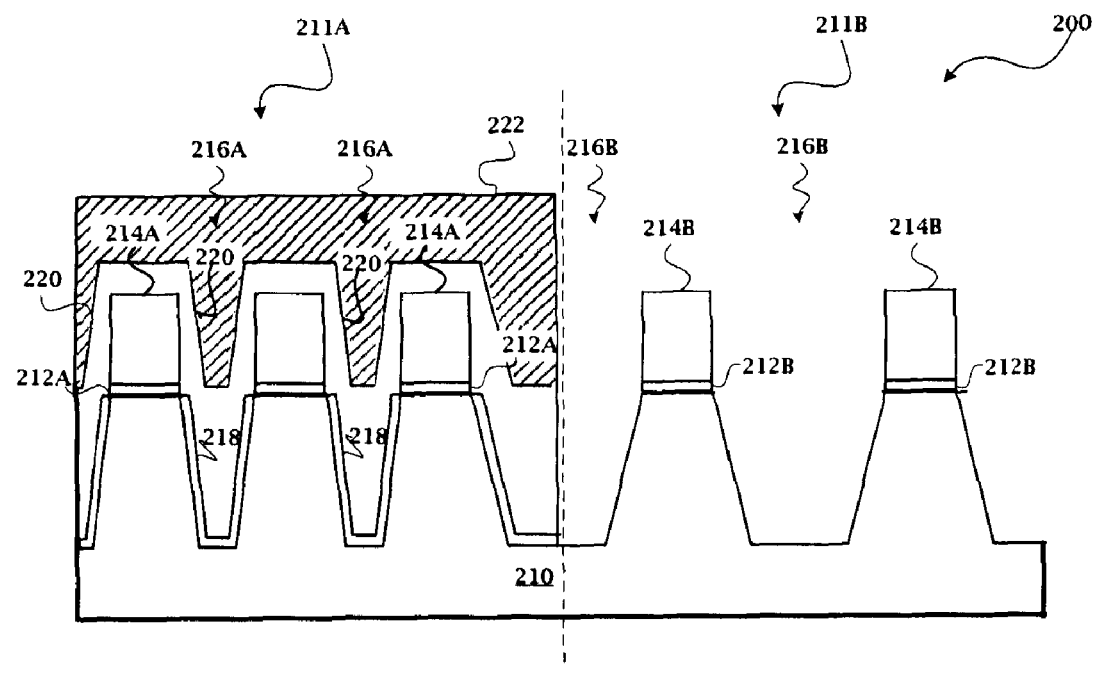
Figure 2E:
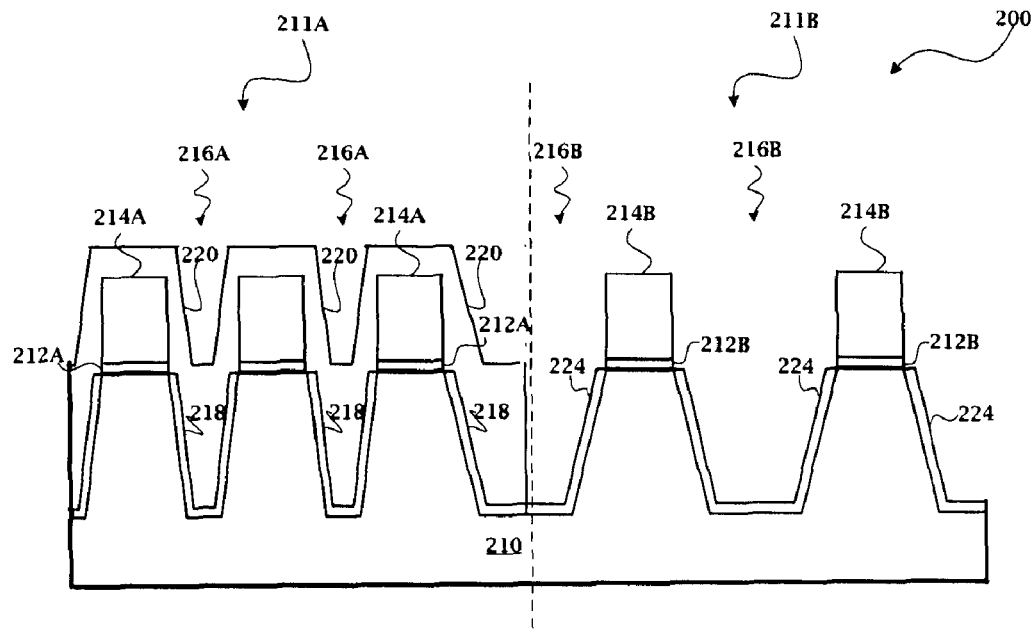
Figure 2F:
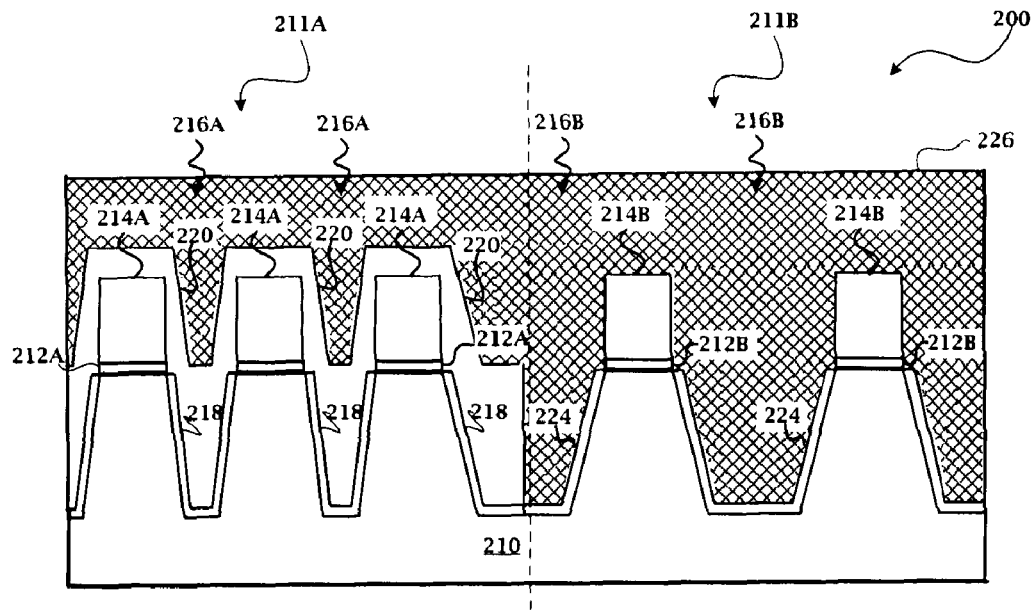
Figure 2G:
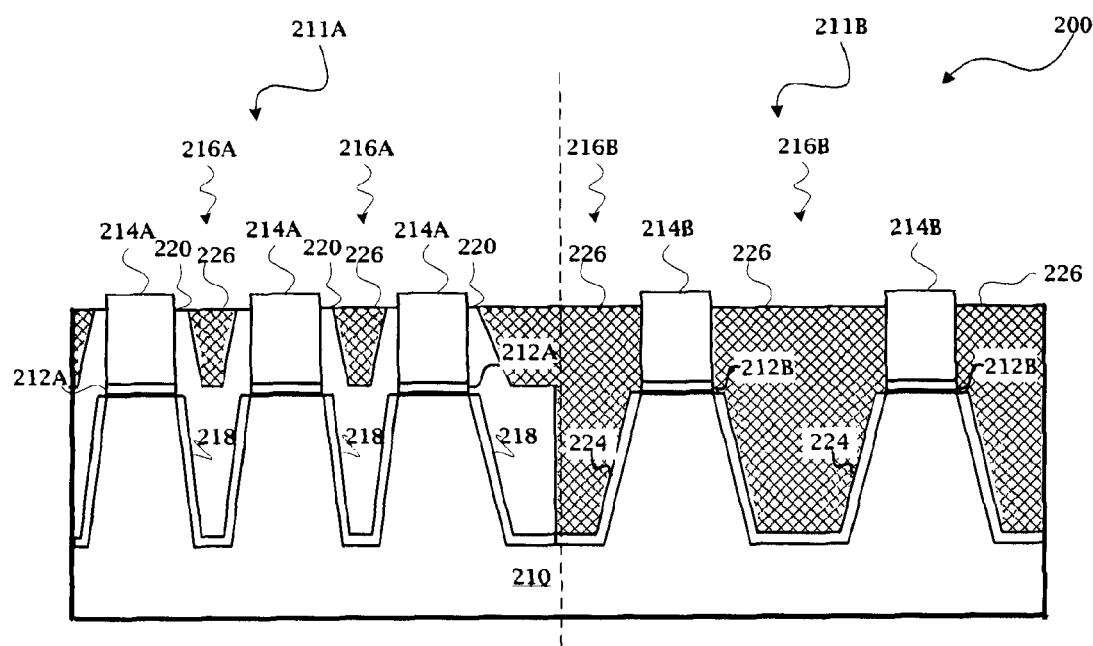

With reference to FIGS. 1 through 2G, a method 100 and a semiconductor device 200 are collectively described below. FIG. 1 is a flow chart of one embodiment of the method 100 for making the semiconductor device 200. FIGS. 2A-2G are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200. The present embodiment of method 100 and semiconductor device 200 eliminates voids arising during gap filling processes, despite varied aspect ratios.

Referring to FIGS. 1 and 2A, the method 100 begins at step 102 wherein a semiconductor substrate 210 including first region 211A and second region 211B is provided. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the semiconductor substrate 210 may comprises a non-semiconductor material.

In the present embodiment, the first region 211A comprises a memory cell area, and the second region 211B comprises a periphery area (e.g., a logic area). For example, a plurality of memory devices may be located and/or formed in the first region 211A, and a plurality of logic devices may be located and/or formed in the second region 211B. In one embodiment, the memory devices located and/or formed in the first region 211A comprise memory transistor devices, and the logic devices located and/or formed in the second region 211B may be MOSFET devices, FinFET devices, and/or other transistor devices employed in logic circuitry and/or sensing circuitry. The first and second regions 211A, 211B may further include a variety of active and passive microelectronic components in various embodiments, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, memory cells, resistors, capacitors, inductors, fuses, other suitable components, and/or combinations thereof.

Further, in the present embodiment, disposed over the semiconductor substrate 210, the first region 211A includes at least one gate structure including a dielectric layer 212A and a gate layer 214A and the second region 211B includes at least one gate structure including a dielectric layer 212B and a gate layer 214B. It is understood that a plurality of gate structures including dielectric layers 212A, 212B and gate layers 214A, 214B may be formed by any suitable process. For example, the at least one gate structures may be formed by conventional deposition, photolithography patterning, and etching processes, and/or combinations thereof. The deposition processes may include chemical vapor deposition (CVD), physical vapor deposition (PVD), atomic layer deposition (ALD), sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the at least one gate structures may be formed simultaneously, utilizing the same processing steps and processing materials; independently of one another, utilizing varying processing steps and processing materials; or using a combination of simultaneous and independent processing steps and processing materials.

The dielectric layers 212A, 212B are disposed on the semiconductor substrate 210. The dielectric layers 212A, 212B may be any suitable dielectric material. The dielectric layers 212A, 212B may further include a multilayer structure comprising multiple dielectric materials. The dielectric layers 212A, 212B may comprise a high-k dielectric material, which may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfraO, HfTaTiO, HfTiO, HfZrO, HfAlON, and/or combinations thereof. Examples of the dielectric material further include silicon oxide, silicon nitride, silicon oxynitride, hafnium oxide, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the dielectric layers 212A, 212B may comprise a layer of silicon dioxide and a layer of high-k dielectric material. Further, the dielectric layers 212A, 212B may be doped polycrystalline silicon with the same or different doping. In the present embodiment, the dielectric layers 212A, 212B comprise a TEOS oxide.

The gate layers 214A, 214B of the gate structure are disposed over the dielectric layers 212A, 212B, respectively. The gate layers 214A, 214B may comprise polycrystalline silicon; silicon-containing materials, such as silicon nitride, silicon oxide, silicon carbide, silicon oxynitride; germanium-containing materials; metal, such as aluminum, copper, tungsten, titanium, tantulum, titanium nitride, tantalum nitride, nickel silicide, cobalt silicide; other suitable materials; and/or combinations thereof. In the present embodiment, the gate layers 214A, 214B comprise silicon nitride. The gate layers 214A, 214B may further include a multilayer structure. Further, the gate layers 214A, 214B may be doped polycrystalline silicon with the same or different doping.

It is understood that the at least one gate structures in first and second regions 211A, 211B may comprise additional layers. For example, the at least one gate structures may comprise hard mask layers, interfacial layers, capping layers, diffusion/barrier layers, dielectric layers, metal layers, other suitable layers, and/or combinations thereof. Also, the semiconductor device 200 may include antireflective coating layers or bottom antireflective coating layers. The at least one gate structures may further include gate spacer liners and gate spacers. The gate spacer liners may comprise any suitable material, such as a spacer oxide. The gate spacers, which may be positioned on each side of the at least one gate structures, may comprise a dielectric material such as silicon nitride, silicon oxide, silicon carbide, silicon oxynitride, other suitable materials, or combinations thereof. In some embodiments, the gate spacer liners and/or the gate spacers may comprise a multilayer structure. The gate spacer liners and gate spacers may be formed by any suitable process.

The method 100 proceeds to step 104 by forming at least one isolation region having a first aspect ratio 216A in the first region 211A and at least one isolation region having a second aspect ratio 216B in the second region 211B. The at least one isolation regions 216A, 216B are formed by any suitable process on the semiconductor substrate 210. The isolation regions 216A, 216B may utilize isolation technology, such as local oxidation of silicon (LOCOS) or shallow trench isolation (STI), to define and electrically isolate the various regions. In the present embodiment, the isolation regions 216A, 216B include a STI. It is understood that a plurality of isolation regions having a first aspect ratio 216A in the first region 211A and a plurality of isolation regions having a second aspect ratio 216B in the second region 211B may be formed.

As one example, the formation of the at least one isolation regions (i.e., STIs) in the first and second regions 211A, 211B may include patterning the semiconductor substrate by a conventional photolithography process and etching trenches in the substrate (for example, by using a dry etching, wet etching, and/or plasma etching process). The patterning and etching may result in trenches with varying aspect ratios. In the present embodiment, the resulting trenches provide the first aspect ratio greater than the second aspect ratio, which results in the first region 211A (e.g., the memory cell area) being more dense than the second region 211B (e.g., the logic area).

Conventional processing follows by filling the trenches with the same deposition process, despite the varying aspect ratios, with a dielectric material. For example, typically, the method would continue with a high density plasma process to simultaneously fill the at least one isolation region having the first aspect ratio 216A and the at least one isolation region having the second aspect ratio 216B. However, it has been observed that, due to the varying aspect ratios of the trenches, isolation regions having higher aspect ratios are not completely filled, resulting in voids within the isolation regions having higher aspect ratios. In other words, in the present embodiment, the at least one isolation region having the first aspect ratio 216A, which has a higher aspect ratio than the at least one isolation region having the second aspect ratio 216B, contains voids after conventional processing. Such voids lead to poor device performance.

Accordingly, the present invention provides a method wherein isolation regions having varying aspect ratios are filled by separate processes. Isolation regions having a higher aspect ratio, therefore having an overall denser device area, are filled by a high aspect ratio deposition process (HARP); and isolation regions having a lower aspect ratio, therefore having an overall less dense device area, are filled by a high density plasma deposition process (HDP). For example, as further discussed below, the at least one isolation region having the first aspect ratio 216A in the first region 211A, the memory cell area, is filled by the HARP process; and the at least one isolation region having the second aspect ratio 216B in the second region 211B, the logic area, is filled with the HDP process. Utilizing separate processes, particularly the HARP process in the memory cell area, eliminates voids and reduces junction leakage in memory cell areas, or higher density device areas. Further, because the voids are eliminated, the memory cell areas provide improved device performance.

In some embodiments, the method 100 continues with forming a first liner layer 218 over the semiconductor substrate 210 as illustrated in FIG. 2B. The first liner layer 218 may be formed by any suitable process. In the present embodiment, forming the first liner layer 218 may comprise growing a thermal oxide trench liner over the at least one isolation regions 216A, 216B in the first and second regions 211A, 211B, respectively. In some embodiments, forming the first liner layer 218 may further include growing a pad oxide. It is understood that the first liner layer 218 may include multiple layers. The first liner layer 218 may further include any suitable thickness, such as a thickness ranging from approximately 30 Å to 100 Å.

At step 106, a first deposition process is performed to deposit a first layer 220 over the first and second regions 211A, 211B of the semiconductor substrate 210. In the present embodiment, the first layer 220 is deposited over the first liner layer 218 as illustrated in FIG. 2C. The first deposition process comprises a HARP process as discussed above. The HARP process adequately fills isolation regions with higher aspect ratios. Further, the HARP process effectively eliminates undesirable voids and improves device performance in denser areas of semiconductor device 200 (i.e., the first region 211A including the at least one isolation region having the first aspect ratio 216A). The HARP process may deposit any suitable material, such as silicon oxide, silicon oxynitride, a low-k material, and/or a HARP oxide. In some embodiments, the first layer 220 comprises a thickness of approximately 5,000 Å to 10,000 Å. In some embodiments, after the first layer 220 is deposited, an annealing process may be performed, such as annealing the deposited HARP oxide. The annealing process may comprise a temperature ranging from approximately 1,000° C. to 1,200° C. for a time period ranging from approximately 10 minutes to 5 hours.

Referring to FIGS. 1 and 2D, at step 108, the first layer 220 is removed from the second region 211B of the semiconductor device 200. The first layer 220 may be removed by any suitable process. For example, removing the first layer 220 in the second region 211B may comprise masking the first region 211A with a photoresist layer 222, etching the first layer 220 and first liner layer 218 from the second region 211B, and removing the photoresist layer 222. The etching process may comprise any suitable process and may include multiple etching steps to remove the first layer 220 and first liner layer 218 over the at least one isolation region having the second aspect ratio 216B. In some embodiments, the etching process comprises a dry etching process (e.g., utilizing fluorine) in combination with a wet etching process (e.g., utilizing a hydrofluoric etching solution). Removing the photoresist layer 222 may comprise any suitable process. In some embodiments, removing the photoresist layer 222 may comprise a stripping and/or ashing process.

In some embodiments, the method 100 continues with forming a second liner layer 224 over the second region 211B as illustrated in FIG. 2E. The second liner layer 224 may be formed by any suitable process. In the present embodiment, forming the second liner layer 224 may comprise growing a thermal oxide trench liner over the at least one isolation region 216B in the second regions 211B. In some embodiments, forming the second liner layer 224 may further include growing a pad oxide. It is understood that the second liner layer 224 may include multiple layers. The second liner layer 224 may further include any suitable thickness, such as a thickness ranging from approximately 30 Å to 100 Å.

At step 110, a second deposition process is performed to deposit a second layer 226 over the first and second regions 211A, 211B of the semiconductor device 200. In the present embodiment, the second layer 226 is deposited over the first layer 220 and the second liner layer 224 as illustrated in FIG. 2F. The second deposition process comprises a HDP process as discussed above. The HDP process adequately fills the at least one isolation region having the second aspect ratio 216B. The HDP process may deposit any suitable material, such as silicon oxide, silicon oxynitride, a low-k material, and/or a HDP oxide. In some embodiments, the second layer 226 comprises a thickness of approximately 5,000 Å to 10,000 Å.

Thereafter, as illustrated in FIG. 2G, a chemical mechanical polishing (CMP) process may be performed on the first layer 220 and the second layer 226 to planarize and polish the first and second layers 220, 226 until the at least one gate structures are exposed in the first and second regions 211A, 211B. It is understood that the semiconductor device 200 may undergo further CMOS or MOS technology processing to form various features known in the art. In still another example, various contacts/vias and multilayer interconnect features (e.g., metal layers and interlayer dielectrics) may be formed on the substrate 210 and configured to connect the various features or structures of the semiconductor device 200.

Overall, the disclosed embodiments provide one or more of the following advantages: (1) improves overall device performance, particularly high-k/metal gate device performance; (2) eliminates voids in gaps with higher aspect ratios (e.g., isolation regions in memory cell areas); (3) improves high-k metal gate logic areas narrow width performance; and (4) decreases isolation region junction leakage in memory cell areas. In one embodiment, a method for fabricating an integrated circuit comprises providing a semiconductor substrate including a first region and a second region; forming at least one isolation region having a first aspect ratio in the first region and at least one isolation region having a second aspect ratio in the second region; performing a high aspect ratio deposition process to form a first layer over the first and second regions of the substrate; removing the first layer from the second region; and performing a high density plasma deposition process to form a second layer over the first and second regions of the substrate.

The first aspect ratio may be greater than the second aspect ratio. In some embodiments, the first region comprises a memory cell area and the second region comprises a logic area. In some embodiments, the first layer and the second layer comprises a thickness ranging from approximately 5,000 Å to 10,000 Å. The first layer and the second layer comprises an oxide.

The method may further comprise annealing the first layer over the first and second regions of the substrate; and performing a chemical mechanical planarization on the first and second layers over the first and second regions. In some embodiments, annealing the first layer comprises a temperature ranging from approximately 1,000° C. to 1,200° C. for a time period ranging from approximately 10 minutes to 5 hours. The method may further comprise forming a first liner layer over the first and second isolation regions prior to forming a first layer; and forming a second liner layer over the second isolation region prior to forming the second layer.

The method of claim 7 wherein the first liner layer and the second liner layer comprises a thickness ranging from approximately 30 Å to 100 Å. In some embodiments, removing the first layer from the second region comprises forming a masking layer over the first region and etching the first layer in the second region. Further, the at least one isolation region having the first aspect ratio and the at least one isolation region having the second aspect ratio may comprise a shallow trench isolation.

In one embodiment, a method for fabricating an integrated circuit comprises providing a substrate; forming a first set of isolation regions and a second set of isolation regions having different aspect ratios; filling the first set of isolation regions by a first deposition process including a high aspect ratio deposition process; and filling the second set of isolation regions by a second deposition process including a high density plasma deposition process.

Forming the first set of isolation regions and the second set of isolation regions may comprise etching the substrate to form at least one trench. In some embodiments, filling the first set of isolation regions and the second set of isolation regions comprises filling the regions to a thickness ranging from approximately 5,000 Å to 10,000 Å. The method of claim 12 wherein forming the first set of isolation regions and the second set of isolation regions having different aspect ratios comprises forming the first set of isolation regions with an aspect ratio greater than the second set of isolation regions.

In some embodiments, the method further comprises forming a first liner layer over the first set of isolation regions prior to filling the first set of isolation regions by the first deposition process; and forming a second liner layer over the first set of isolation regions prior to filling the second set of isolation regions by the second deposition process. The first and second liner layers may comprise a thickness ranging from approximately 30 Å to 100 Å. In some embodiments, the method further comprises performing an annealing process after filling the first set of isolation regions; and performing a chemical mechanical planarization after filling the first set of isolation regions and the second set of isolation regions. The annealing process may comprise a temperature ranging from approximately 1,000° C. to 1,200° C. for a time period ranging from approximately 10 minutes to 5 hours.

In one embodiment, a method for fabricating an integrated circuit comprises providing a substrate; forming a first trench and a second trench on the substrate; filling the first trench with a first deposition process including a high aspect ratio process oxide; and filling the second trench with a second deposition process including a high density plasma oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, the method comprising:
    providing a substrate including a first region and a second region;
    forming a gate dielectric material layer on the substrate in the first and second regions;
    forming a gate electrode on the gate dielectric material in the first and second regions;
    forming a first trench in the first region, the first trench having a first aspect ratio in the first region and extending through the gate electrode, the dielectric material, and into the substrate;
    forming a second trench in the substrate through the second region, the second trench having a second aspect ratio in the second region, wherein the first aspect ratio is greater than the second aspect ratio;
    performing a high aspect ratio deposition process to form a first layer over the first and second regions of the substrate, wherein the first layer fills the first and second trenches;
    removing the first layer from the second region, wherein the first layer is removed from the second trench, wherein removing the first layer from the second region comprises forming a masking layer over the first region and etching the first layer in the second region; and
    performing a high density plasma deposition process to form a second layer over the first and second regions of the substrate, wherein the second layer fills the second trench and the first trench.

2. The method of claim 1 wherein the first region comprises a memory cell area and the second region comprises a logic area.

3. The method of claim 1 wherein the first layer and the second layer comprises a thickness ranging from approximately 5,000 Å to 10,000 Å.

4. The method of claim 1 wherein the first layer and the second layer comprises an oxide.

5. The method of claim 1 further comprising:
    annealing the first layer over the first and second regions of the substrate; and
    performing a chemical mechanical planarization on the first and second layers over the first and second regions.

6. The method of claim 5 wherein annealing the first layer comprises a temperature ranging from approximately 1,000° C. to 1,200° C. for a time period ranging from approximately 10 minutes to 5 hours.

7. The method of claim 1 further comprising:
    forming a first liner layer in the first and second trenches prior to forming the first layer; and
    forming a second liner layer in the second trench prior to forming the second layer.

8. The method of claim 7 wherein the first liner layer and the second liner layer comprises a thickness ranging from approximately 30 Å to 100 Å.

9. The method of claim 1 wherein the first trench filled with the first layer and the second trench filled with the second layer are shallow trench isolation features.

10. A method for fabricating an integrated circuit, the method comprising:
   providing a substrate;
   forming a dielectric layer on the substrate;
   forming a conductive layer on the dielectric layer;
   forming a first set of isolation regions through the conductive layer, the dielectric layer, and into the substrate;
   forming a second set of isolation regions through the conductive layer, the dielectric layer, and into the substrate, the second set of isolation regions having different aspect ratios than the first set of isolation regions;
   filling the first set of isolation regions by a first deposition process including a high aspect ratio deposition process; and
   filling the second set of isolation regions by a second deposition process including a high density plasma deposition process, wherein the filling the first set of isolation regions and the second set of isolation regions provides a filled first set of trenches that include a high density plasma deposition process material and a high aspect ratio deposition process material and a filled second set of trenches free of a high aspect ratio deposition process material.

11. The method of claim 10 wherein forming the first set of isolation regions and the second set of isolation regions comprises etching the substrate to form at least one trench.

12. The method of claim 10 wherein filling the first set of isolation regions and the second set of isolation regions comprises filling the regions to a thickness ranging from approximately 5,000 Å to 10,000 Å.

13. The method of claim 10 wherein forming the first set of isolation regions and the second set of isolation regions having different aspect ratios comprises forming the first set of isolation regions with an aspect ratio greater than the second set of isolation regions.

14. The method of claim 10 further comprising:
   forming a first liner layer in the first set of isolation regions prior to filling the first set of isolation regions by the first deposition process; and
   forming a second liner layer in the first set of isolation regions prior to filling the second set of isolation regions by the second deposition process.

15. The method of claim 14 wherein the first liner layer and the second liner layer comprises a thickness ranging from approximately 30 Å to 100 Å.

16. The method of claim 10 further comprising:
   performing an annealing process after filling the first set of isolation regions; and
   performing a chemical mechanical planarization after filling the first set of isolation regions and the second set of isolation regions.

17. The method of claim 16 wherein the annealing process comprises a temperature ranging from approximately 1,000° C. to 1,200° C. for a time period ranging from approximately 10 minutes to 5 hours.

18. A method for fabricating an integrated circuit, the method comprising:
   providing a substrate having a gate dielectric material layer and a gate electrode formed in a first region and a second region of the substrate;
   forming a first trench extending into the substrate through the gate dielectric material layer and the gate electrode in the first region and a second trench extending into the substrate through the gate dielectric material layer and the gate electrode in the second region;
   filling the first trench with a first deposition process including a high aspect ratio process oxide; and
   filling the first and second trenches with a second deposition process including a high density plasma oxide,
   wherein the filling the first trench with the first deposition process and the filling the first and second trenches with the second deposition process provides a filled first trench that includes the high density plasma oxide and a filled second trench free of the high aspect ratio process oxide.

19. The method of claim 18, wherein filling the first trench with the first deposition process includes filling the second trench with the high aspect ratio process oxide and removing the high aspect ratio process oxide from the second trench by forming a masking layer over the first region and etching the high aspect ratio process oxide in the second trench.

20. The method of claim 18, wherein the first region comprises a memory cell area and the second region comprises a logic area.

* * * * *